United States Patent
Monser et al.

(10) Patent No.: US 11,062,927 B2
(45) Date of Patent: Jul. 13, 2021

(54) DEVICE AND METHOD FOR CONTACTLESSLY TRANSFERRING AT LEAST PARTLY FERROMAGNETIC ELECTRONIC COMPONENTS FROM A CARRIER TO A SUBSTRATE

(71) Applicant: Muehlbauer GmbH & Co. KG, Roding (DE)

(72) Inventors: Hans-Peter Monser, Dresden (DE); Sigmund Niklas, Zell (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 58 days.

(21) Appl. No.: 16/336,436

(22) PCT Filed: Sep. 22, 2017

(86) PCT No.: PCT/EP2017/074044
§ 371 (c)(1),
(2) Date: Mar. 25, 2019

(87) PCT Pub. No.: WO2018/060083
PCT Pub. Date: Apr. 5, 2018

(65) Prior Publication Data
US 2020/0027764 A1    Jan. 23, 2020

(30) Foreign Application Priority Data

Sep. 29, 2016    (DE) ............... 10 2016 011 747.8

(51) Int. Cl.
*H01L 21/67*    (2006.01)
*H01L 21/68*    (2006.01)
(Continued)

(52) U.S. Cl.
CPC .. *H01L 21/67259* (2013.01); *H01L 21/67144* (2013.01); *H01L 21/681* (2013.01);
(Continued)

(58) Field of Classification Search
CPC ......... H01L 21/67259; H01L 21/67144; H01L 21/681; H01L 21/6835; H01L 24/83; H01L 2221/68363; H01L 2224/75261
(Continued)

(56) References Cited

U.S. PATENT DOCUMENTS

| 3,868,759 A | 3/1975 | Hartleroad et al. |
| 3,918,146 A | 11/1975 | Hartleroad et al. |

(Continued)

FOREIGN PATENT DOCUMENTS

| CN | 105493257 A | * | 4/2016 | ............. H01L 24/81 |
| CN | 105493257 A | | 4/2016 | |

(Continued)

OTHER PUBLICATIONS

Ramadan et al. "Large scale microcomponents assembly using an external magnetic array." Applied Physics Letters 30, 172502 (2007), published online.

*Primary Examiner* — Peter Dungba Vo
*Assistant Examiner* — Azm A Parvez
(74) *Attorney, Agent, or Firm* — John A. Miller; Shumaker, Loop & Kendrick, LLP

(57) ABSTRACT

The device and method according to the invention are used to transfer an electronic ferromagnetic component from a carrier to a substrate using a magnetic assembly. The magnetic assembly is designed and arranged to aid in the correct positioning of the at least partly ferromagnetic electronic component on the substrate. The magnetic field generated by the magnetic assembly produces a magnetic force oriented from the carrier towards the substrate, said magnetic force aiding the transfer of the component from the carrier to the substrate such that a significantly increased positioning accuracy of the component is achieved compared to a transfer without said magnetic force.

16 Claims, 4 Drawing Sheets

(51) Int. Cl.
    *H01L 21/683*     (2006.01)
    *H01L 23/00*     (2006.01)

(52) U.S. Cl.
    CPC .......... *H01L 21/6835* (2013.01); *H01L 24/83* (2013.01); *H01L 2221/68363* (2013.01); *H01L 2224/75261* (2013.01)

(58) Field of Classification Search
    USPC ................. 29/739, 729, 700; 438/15, 3, 107
    See application file for complete search history.

(56) References Cited

U.S. PATENT DOCUMENTS

| | | | |
|---|---|---|---|
| 6,049,974 | A | 4/2000 | Asanasavest |
| 8,119,427 | B1 | 2/2012 | Lu |
| 2004/0111875 | A1 | 6/2004 | Hogerl et al. |
| 2006/0007297 | A1* | 1/2006 | Doi .................... H01L 21/6835 347/224 |
| 2011/0262258 | A1 | 10/2011 | Peng et al. |
| 2011/0291302 | A1 | 12/2011 | Mueller et al. |
| 2014/0238592 | A1* | 8/2014 | Marinov ............... B32B 37/025 156/272.8 |
| 2014/0291119 | A1* | 10/2014 | Courts .............. H01L 21/67132 198/468.2 |
| 2016/0155892 | A1 | 6/2016 | Li et al. |

FOREIGN PATENT DOCUMENTS

| | | |
|---|---|---|
| DE | 102008062211 A1 | 6/2010 |
| JP | 2006313871 A | 11/2006 |
| WO | 2015085064 A | 6/2015 |

\* cited by examiner

DEVICE AND METHOD FOR CONTACTLESSLY TRANSFERRING AT LEAST PARTLY FERROMAGNETIC ELECTRONIC COMPONENTS FROM A CARRIER TO A SUBSTRATE

CROSS-REFERENCE TO RELATED APPLICATIONS

This application is a National Stage application of International Application No. PCT/EP2017/074044 filed Sep. 22, 2017, which claims priority to German Patent Application Serial No. DE 10 2016 011 747.8, filed Sep. 29, 2016.

BACKGROUND

Field

A device and a method for contactlessly transferring at least partly ferromagnetic electronic components from a carrier to a predetermined place on a substrate are described here. Aspects of the device and the method are defined both in the description and in the figures and claims.

Discussion

When transferring electronic components, in particular dies, and in particular when transferring singulated electronic components, the problem generally exists that the electronic components are subjected to continuous miniaturisation, wherein the requirements in respect of the accuracy of the placement when transferring the electronic components from the carrier to the substrate are continuously increasing.

A contactless method of transferring electronic components is advantageous not least on account of the particularly high demands for contaminant-free manufacturing techniques in die production and for reasons of time efficiency related to the manufacturing process. However, methods for the contactless assembly of electronic components have not been able to become established on account of too imprecise a placement of the components on the target substrate.

Electronic components with at least partly ferromagnetic properties are known as the prior art, e.g. dies with so-called NI/AU connection faces (bumps).

Moreover, a method is known, e.g. in connection with RFID dies, in which raised connection faces are replaced by large-scale metallisations. In such a case the opportunity exists to use e.g. nickel as a ferromagnetic constituent of the metallisation layers.

U.S. Pat. No. 8,119,427 B1 discloses a device and a method for the temporary fixing of an LED at a desired position by means of a magnet, while other working steps are carried out in parallel, in particular the filling of the workpiece enclosing the LED with epoxy resin.

JP 2006,31387 1A discloses a device and a method for adjusting electronic components on an intermediate carrier or substrate with the aid of the magnetic properties of the components.

U.S. Pat. No. 3,918,146 A illustrates the subject matter of the preamble of Claim 1.

US 2011/0291302 relates to a method with the steps: Production of a structure on the carrier, wherein the structure is suitable to align an electronic component on it, so that the electronic component can assume a desired target position relative to the structure, coating of the structure with a material to form a liquid meniscus, wherein the liquid meniscus is suitable for at least partly receiving the electronic component, provision of a reserve with a plurality of electronic components at a delivery point for the electronic components, movement of the carrier with the structure at least nearby and opposite to the delivery point, contactless delivery of one of the electronic components by the delivery point while the structure on the carrier is located close to the delivery point in such a way that the electronic component, after it has left the reserve, is not held or guided mechanically by any mechanical device, so that after a free phase the electronic component at least partly touches the material, movement of the carrier with the structure to a downstream processing point, while the electronic component aligns itself on the liquid meniscus on the structure itself in order to assume its target position, and attachment of the electronic component on the carrier on the structure with the material remaining at least partly between the structure and the electronic component. A laser light source is located at the delivery point for initiating a contactless delivery of one of the components by the delivery point.

The object thus exists of providing a device and a method for contactlessly transferring an at least partly ferromagnetic electronic component from a carrier to a substrate with high precision and at high speed.

SUMMARY

To achieve this object, a device is proposed for contactlessly transferring an at least partly ferromagnetic electronic component from a carrier to a substrate. Here the device comprises the features of Claim 1.

The arrangement disclosed and claimed here permits a significant increase in precision compared with known contactless transfer methods. Due to the present arrangement, physical contact with the at least partly ferromagnetic components for precise positioning on a substrate is no longer necessary. Certain metals always have ferromagnetic properties at room temperature. Examples of these are iron, nickel or cobalt. Electronic components mostly contain nickel, at least in part. The option also exists in the manufacture of electronic components of adding nickel targetedly, in order to bring about ferromagnetic properties. Compared with similarly precise known methods, a significant increase in the transfer speed of the components is involved, as no mechanical positioning tools have to be moved any longer. Both a high transfer rate and a high placement precision can be achieved with the present arrangement.

Depending on the implementation variant, the magnetic arrangement can be both a very simple magnetic arrangement (in the simplest case a single permanent magnet) and a complex magnetic arrangement of several electromagnets, which can be controlled by a control unit independently of one another via their power supply. Thus a transfer path from the carrier to the substrate is also possible that is not rectified with the gravitational force. A combination of permanent magnets and electromagnets is also possible.

In one variant, magnets of the magnetic arrangement are to be moved and/or swivelled respectively by magnet adjustment or positioning devices, at least in a limited area.

In one variant the components are attached to the carrier by a thermally deactivatable adhesive. This permits the use of an arrangement in which the detachment unit for detaching the components from the carrier is a heat source that is controllable in intensity, in particular a laser.

In one variant the component is attached to the carrier by an adhesive that can be reduced in adhesive power by UV radiation (ultraviolet light). The laser is configured and arranged to cause the detachment of the components by vaporization of the immediate boundary layer of the adhesive on the components.

In one variant a mask is positioned between the dispensing carrier and the laser. This mask is configured and arranged to adapt the geometry of a laser beam to the base area of the components located on the carrier.

The laser is implemented as a stationary detachment unit and only the laser beam emitted by the detachment unit is reflected by a mirror arrangement onto a predetermined place. The mirror arrangement consists in this case of one or more mirrors, which are each configured and arranged to be moved and/or swivelled by mirror positioning actuators, at least in a limited area.

In one variant the holding fixture for the carrier is configured and arranged to be moved and/or swivelled by a first actuator, at least in a certain area.

In one variant the holding fixture for the substrate is configured and arranged to be moved and/or swivelled by a second actuator, at least in a certain area.

In other exemplary embodiments the holding fixture for the substrate can also be an assembly line, in particular a conveyor belt, on which a plurality of substrate units are led past the carrier, either continuously or successively for the purpose of positioning one or more ferromagnetic electronic components.

In one variant the second holding fixture for the substrate is configured and arranged to move the substrate successively or continuously relative to the first holding fixture for the dispensing carrier, wherein the substrate has a plurality of predetermined places for receiving components. The substrate is guided in this case over a support, which supports the substrate from the side facing away from the component and is thereby conducive to a precise positioning of the components. At least a portion of the magnetic arrangement can also be accommodated or integrated at least partly in a receiving device of the support provided for this. The support itself has no ferromagnetic properties here; on the contrary, the support is non-magnetic and magnetically permeable.

In another variant the magnetic arrangement can be positioned underneath the support by a magnet holder suitable for this. In this variant also magnets of the magnetic arrangement are able to be moved and/or swivelled respectively by magnet adjustment or positioning devices, at least in a limited area. In particular, the magnet holder with the magnetic arrangement is able to be moved and/or swivelled as a whole by magnet adjustment or positioning devices, at least in a limited area. The magnet holder can be formed, for example, as a swivellable and/or movable support arm.

In one variant the substrate is configured and arranged to be moved incrementally or continuously from a first roll to a second roll and to be guided in this process over the support. In this case the dies can be cured, in particular by thermocompression or by pressure and/or UV light, prior to rolling by a curing station, at which point the speed of the substrate transport can be decoupled from the speed of the substrate on detachment of the die.

In one variant the device comprises a first sensor, in particular an imaging sensor, which is configured and arranged to determine a position of the component on the carrier directly and/or by detection of a reference marking with a known geometrical position to the component.

Since the laser as heat source and the mirror apparatus are provided for the device, the first sensor, which in this variant is an optical sensor in particular, uses the same optical beam path as the laser.

In one variant the device comprises a second sensor, in particular an imaging sensor, which is configured and arranged to determine a position of the component on the substrate directly and/or by the additional detection of a reference marking with a known geometrical position to the provided positioning point of the component.

In one variant the device comprises a programmable control unit with memory function (electronic control unit/ ECU), which is configured and arranged to evaluate and store information from the sensors. By means of the sensor information and stored position data of the marking aids and externally supplied or stored information that contains a selection of the components to be transferred, the ECU facilitates control of the actuators of the two holding fixtures, the positioning actuator, the intensity of the detachment unit, the mirror positioning actuators, the magnet adjustment or positioning devices and the power supplies of the electromagnets, which supplies are independent of one another.

A method for transferring an at least partly ferromagnetic electronic component from a carrier to a substrate is also disclosed and claimed.

The method comprises the steps of Claim 9:

The magnetic field is produced by a magnetic arrangement. Depending on the implementation variant, this can be produced likewise by a very simple magnetic arrangement (in the simplest case a single permanent magnet) and a complex magnetic arrangement of several electromagnets controlled independently of one another by a control unit. A combination of permanent magnets and electromagnets is also possible.

In one variant one or more electromagnets are controlled via a power supply that can be regulated separately from one or more other electromagnets. Transfer paths are realised by this that do not run rectified to the gravitational force.

One variant of the method makes use of an arrangement of a plurality of permanent magnets or electromagnets of different strength or an arrangement of a plurality of electromagnets of different control, which produces an inhomogeneous magnetic field. This counteracts a rotation of the component during the transfer process, triggered for example by an uneven detachment of the component from the adhesive film.

In one variant individual magnets of the magnetic arrangement are moved and/or swivelled by magnet adjustment or positioning devices, at least in a limited area.

The component is attached to the carrier by a thermally deactivatable adhesive and the detachment of the components from the carrier takes place by a laser that is controllable in its intensity.

In one variant the component is attached to the carrier by an adhesive that can be reduced in its adhesive force by UV radiation. The intensity of the controllable laser detaches the components from the carrier by vaporization of the immediate boundary layer of the adhesive on the components.

In one variant a mask is positioned between the dispensing carrier and the laser. This mask adapts the geometry of a laser beam to the base area of the components located on the carrier.

The laser is implemented as a stationary detachment unit and only the laser beam emitted by the detachment unit is reflected by an arrangement of movable mirrors onto a predetermined place. The mirror arrangement consists in this case of one or more mirrors, which are moved and/or swivelled by mirror positioning actuators, at least in a limited range.

In one variant the method comprises a first sensor, in particular an imaging sensor, which determines a position of the component on the carrier directly and/or by detection of a reference marking with a known geometrical position to the component.

In one variant, which provides a laser as heat source and a mirror apparatus for the method, the first sensor, which in this variant is an optical sensor in particular, uses the same optical beam path as the laser.

In one variant the device comprises a second sensor, in particular an imaging sensor, which determines a position of the component on the substrate directly and/or by the additional detection of a reference marking with a known geometrical position to the provided positioning point of the component.

In one variant the device comprises a programmable control unit with memory function (electronic control unit/ ECU), which evaluates and stores information from the sensors. By means of the sensor information and stored position data of the marking aids and externally supplied or stored information that contains a selection of the components to be transferred, the ECU controls the actuators of the two holding fixtures, the intensity of the detachment unit, the mirror positioning actuators, the magnet adjustment or positioning devices and the power supplies of the electromagnets, which supplies are independent of one another.

DETAILED DESCRIPTION OF THE EMBODIMENTS

Figure 1:
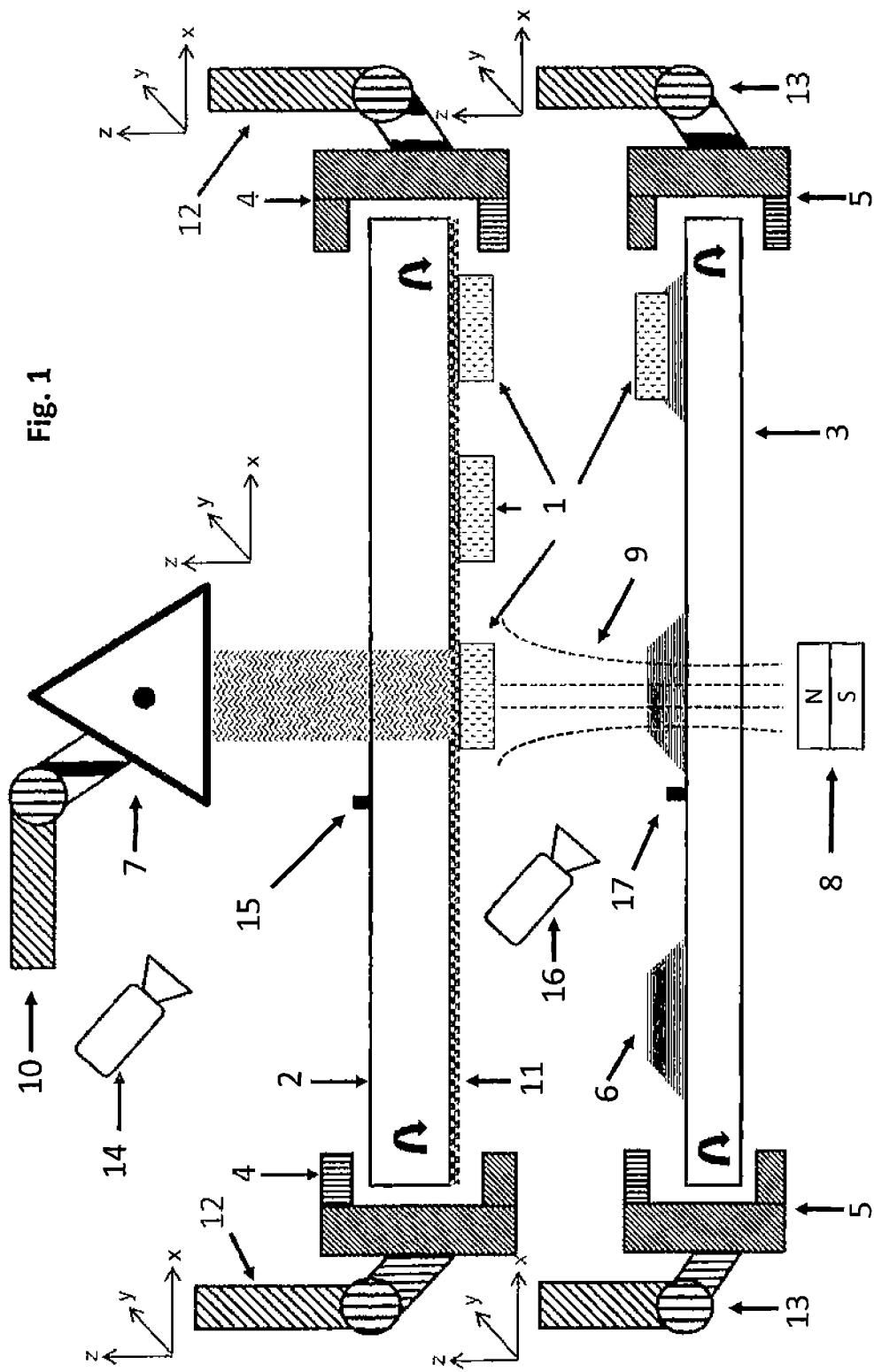
FIG. 1 is a schematic depiction of an exemplary embodiment of the device with a laser and a single permanent magnet.

The device shown in FIG. 1 shows schematically (in cross section) a fork-shaped holding fixture 4, which takes up a wafer foil 2 located in a clamping ring by fixing the clamping ring only at two opposing contact points by one retaining clamp in each case. Neither the front side of the wafer foil 2, on which the components 1 are mounted, nor the opposing rear side are concealed by the fork-shaped holding fixture 4.

In the variant shown in FIG. 1, the at least partly ferromagnetic electronic components 1 are dies with so-called Ni/Au connection faces.

The components 1, described below as dies, are located on the front side of the wafer foil 2 and are attached there by a thermally deactivatable adhesive film 11 ("thermal release tape").

In other embodiments all other types of carriers of electronic components that are used in the manufacturing processes of semiconductor technology can be used instead of the wafer foil 2 described here. The electronic components can be attached by an adhesive, in particular by a thermally deactivatable adhesive to the respective carriers, but this is not necessary in every embodiment. The vaporization of a boundary layer between the electronic component and a wafer foil is also provided in one embodiment.

In one embodiment the adhesive film can also reduce its adhesive force to the die by UV radiation, wherein the heat input associated with this completely removes the adhesion.

Other embodiments can also contain holding fixtures or holders that fix a wafer foil or a carrier completely or at least in parts along its outer edge by different attachment techniques. Embodiments are also possible that contact a wafer foil or a carrier additionally or exclusively at contact points which are not positioned on its outer edge. A partial masking of at least one of the sides of the wafer foil or carrier by a holding fixture or holder can occur in other embodiments.

In the embodiment shown here in FIG. 1, the fork-shaped holding fixture 4 is moved freely in space by an actuator 12, at least in one working area, wherein the actuator 12 includes here a three-dimensionally swivellable electric linear drive, which is controlled by an electronic control unit (ECU) 18. The actuator 12 also includes an electric motor likewise controlled by the ECU 18, which motor causes a rotation of the wafer foil 2 at least up to a certain angle by rotating the retaining clamps, which are used to fix the clamping ring of the wafer foil 2. The wafer foil 2 can be tilted by this. Finally, the actuator 12 described here includes an electromechanical component, likewise controlled by the ECU 18, which brings about the opening or closing of the retaining clamps.

In other embodiments a plurality of other actuators can be used and can either replace or supplement the electric linear drive and the electric motor or the electromechanical element, in particular by hydraulic or pneumatic actuators or other electromechanical elements. Freedom of movement in all three spatial dimensions and the possibility of rotating the wafer foil are not implemented in all embodiments here.

FIG. 1 also shows a substrate 3, to which the dies 1 are transferred. Located on the substrate 3 at several places 6 provided for this are metallisations and adhesive, onto which a die 1 is transferred in each case.

In one embodiment the place 6 provided on the substrate 3 can be an antenna connection pair of an antenna or a conductive adhesive deposit.

In other embodiments the die is first transferred to an intermediate carrier. In one embodiment the substrate is an intermediate carrier with structuring and without adhesive. Embodiments are also possible in which several dies are transferred side by side from the wafer foil to a place provided on the substrate.

FIG. 1 also shows—analogous to the fork-shaped holding fixture 4 of the wafer foil 2—a fork-shaped holding fixture 5, which holds the substrate 3 by fixing it only at two opposing contact points by one retaining clamp in each case. Neither the front side of the substrate 3, on which the places 6 provided for take-up are located, nor the opposing rear side are concealed by the fork-shaped holding fixture 5.

Other embodiments can include holding fixtures or holders that fix the substrate completely or at least in parts along its outer edge by different attachment techniques. Embodiments are also possible that contact the substrate additionally or exclusively at contact points which are not positioned on its outer edge. A partial masking of at least one of the sides of the substrate by a holding fixture or holder can occur in other embodiments.

In one variant the substrate is configured and arranged to be moved incrementally or continuously from a first roll to a second roll and to be guided in this process over the support. In this case the second holding fixture can be a roll pair in particular, wherein one roll of the roll pair can be driven by a servomotor.

In the embodiment shown here in FIG. 1, the fork-shaped holding fixture 5—analogous to the fork-shaped holding fixture 4 of the wafer foil 2—is moved freely in space by an actuator 13, at least in one working area, wherein the actuator 13 includes here a three-dimensionally swivellable electric linear drive, which is controlled by the ECU 18. Moreover the actuator 13 includes an electric motor, likewise controlled via the ECU 18. This causes a rotation of the substrate 3 at least up to a certain angle by rotating the retaining clamps, which are used to fix the substrate 3. The substrate can thus be tilted. Finally, the actuator 13 described here includes an electromechanical component, likewise controlled by the ECU 18, which brings about the opening or closing of the retaining clamps.

In other embodiments a plurality of other actuators can be used and can either replace or supplement the electric linear drive and the electric motor or the electromechanical element, in particular by hydraulic or pneumatic actuators or electromechanical actuators. Freedom of movement in all three spatial dimensions and the possibility of rotating the substrate are not always implemented here.

In the further description of FIG. 1 it is assumed as given that at least during the transfer of the dies 1, the front side of a wafer foil 2 faces the side of the substrate 3 on which the prepared places 6 are located, regardless of whether the described holding fixtures 4 and 5 permit other possible arrangements.

FIG. 1 also shows a laser 7, which can be controlled in its intensity by the ECU 18, for detaching individual dies 1 from the adhesive film 11. To do this the laser 7 irradiates the point lying opposite the component 1 on the rear side of the wafer foil 2 and thus generates a selectively raised temperature. It thereby deactivates the adhesive properties of the adhesive film 11, which is located between the die 1 and the wafer foil 2.

The properties of the laser 7 permit the detachment of a single die 1 without influencing the adhesive properties of the adhesive film 11 in the area of the second die in such a way that this would likewise be detached.

The laser 7 is mounted fixedly. In the variant shown in FIG. 1, which serves purely for understanding, the laser 7 is movable by a positioning actuator 10, wherein the positioning actuator 10 here includes an electric linear drive, which is swivellable in all three spatial dimensions and controlled by the ECU 18. Hereby the laser 7 can be positioned by the positioning actuator 10 in any way, at least in one working area. An electric motor additionally integrated into the positioning actuator 10 and likewise controlled by the ECU 18 permits the rotation of the laser 7, at least up to a certain angle, along an axis orthogonal to the laser beam emitted. The incident angle of the laser beam onto the rear side of the wafer foil 2 can be influenced by this. Since the wafer foil 2 can likewise be rotated as described, this functionality is necessary to avoid a laser beam, which impacts the wafer foil at too flat an angle, unintentionally also detaching adjacent dies due to heating.

In other embodiments a plurality of other actuators can be used and can either replace or supplement the electric linear drive and the electric motor, in particular by hydraulic or pneumatic actuators as well as electromechanical actuators. Freedom of movement in all three spatial dimensions and the possibility of rotating the detachment unit are not always implemented here.

FIG. 1 shows furthermore a stationary permanent magnet 8 positioned directly underneath the provided place 6, which magnet produces a magnetic field 9, which exerts a magnetic force on the die 1. This force attracts the die 1 detached by the laser 7 from the adhesive film 11, so that positioning on the place 6 provided for this on the substrate 3 is at least supported. The magnetic force that acts on the die 1 is always directed in this case from the wafer foil 2 towards the substrate.

FIG. 1 further shows the two camera sensors 14 and 16. The camera sensor 14 determines the position of the marking aid 15 and forwards this information to the ECU 18. Since the geometric position of the marking aid 15 on the wafer foil 2 is known to the ECU 18 as well as the state of rotation of the wafer foil 2, the ECU 18 thus also has the position information of each die 1 on the wafer foil 2.

In another embodiment the camera sensor 14 determines the position of a die 1 on the wafer foil 2 directly and without a marking aid.

In the exemplary embodiment shown, only those dies 1 that were found to be suitable in a preceding quality inspection (which is not part of the device described here) are transferred from the wafer foil 2 to the substrate 3. A list of these positively examined dies and their geometrical position on the wafer foil 2 is stored in the memory of the ECU 18.

The camera sensor 16 determines the position of the marking aid 17 and the position of the places 6 provided for the transfer on the substrate 3 and forwards this information to the ECU 18. Since the geometric position of the marking aid 16 on the substrate 3 is known to the ECU 18 as well as the state of rotation of the substrate 3, the ECU 18 thus also has the position information of each individual place 6 provided on the substrate 3. Since the provided places 6 can also be detected directly by the camera sensor 16 in the present exemplary embodiment, a quality inspection takes place following the conclusion of the transfer process in regard to correct positioning of the die 1 on the place 6 provided on the substrate 3 by the camera sensor 16.

In another embodiment the quality inspection takes place exclusively through another camera sensor provided exclusively for this.

Figure 2:
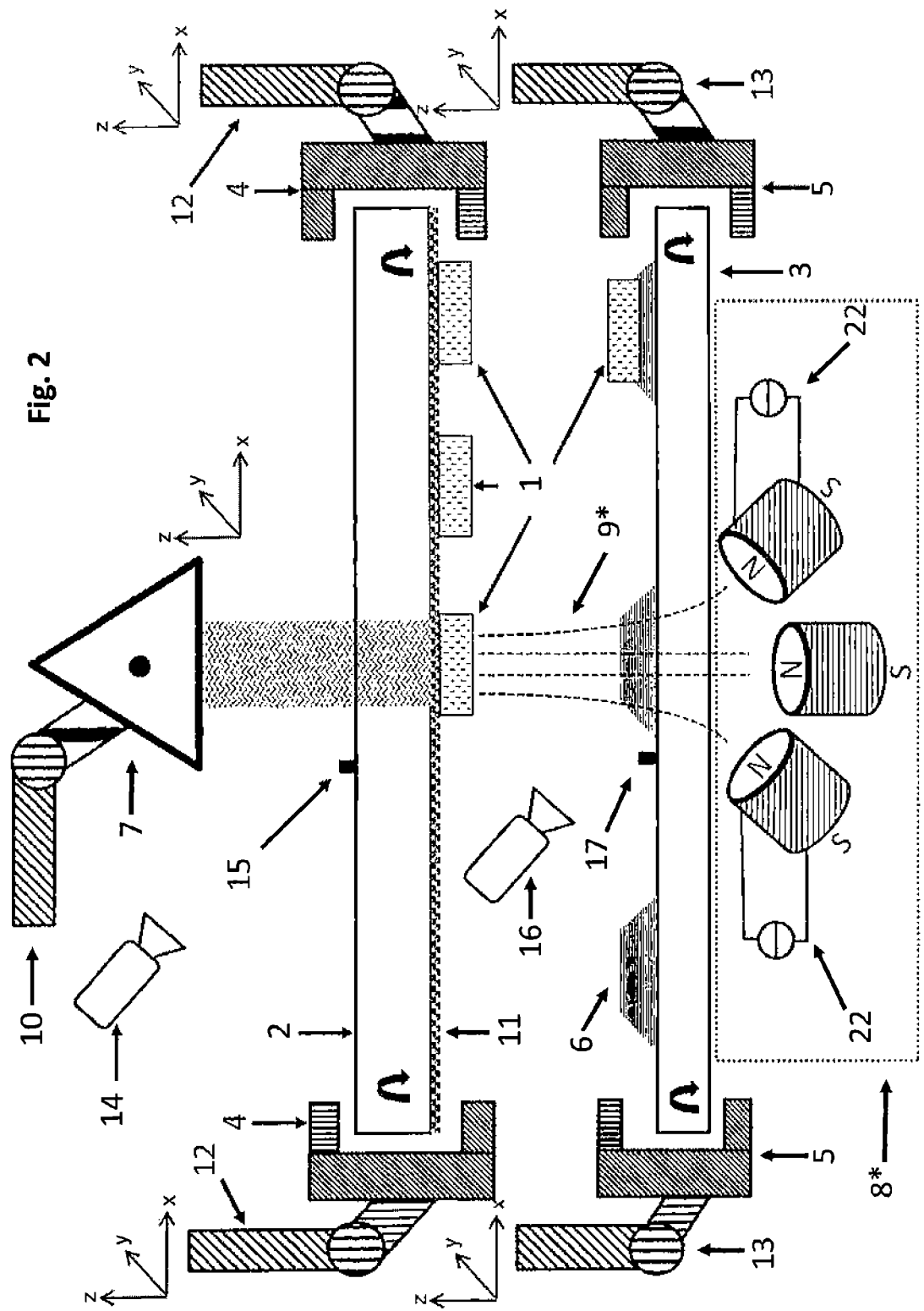
FIG. 2 is a schematic depiction of an exemplary embodiment of the device with a positionable laser and an arrangement of several electromagnets controlled by way of their power supply.

FIG. 2 shows an assemblage like FIG. 1 with the modification that an arrangement of three electromagnets 8* is shown instead of the permanent magnet 8.

In other embodiments any other number of electro- and/or permanent magnets, in particular even a single magnet, can be used.

The electromagnets 8* together produce a magnetic field 9*, which exerts a magnetic force on the die 1. This force attracts the die 1 detached by the laser 7 from the adhesive film 11 in such a way that positioning on the place 6 provided for this on the substrate 3 is at least supported.

Each of the electromagnets 8* shown in FIG. 2 is connected to a power supply 22 that is separately adjustable by the ECU 18.

Figure 3:
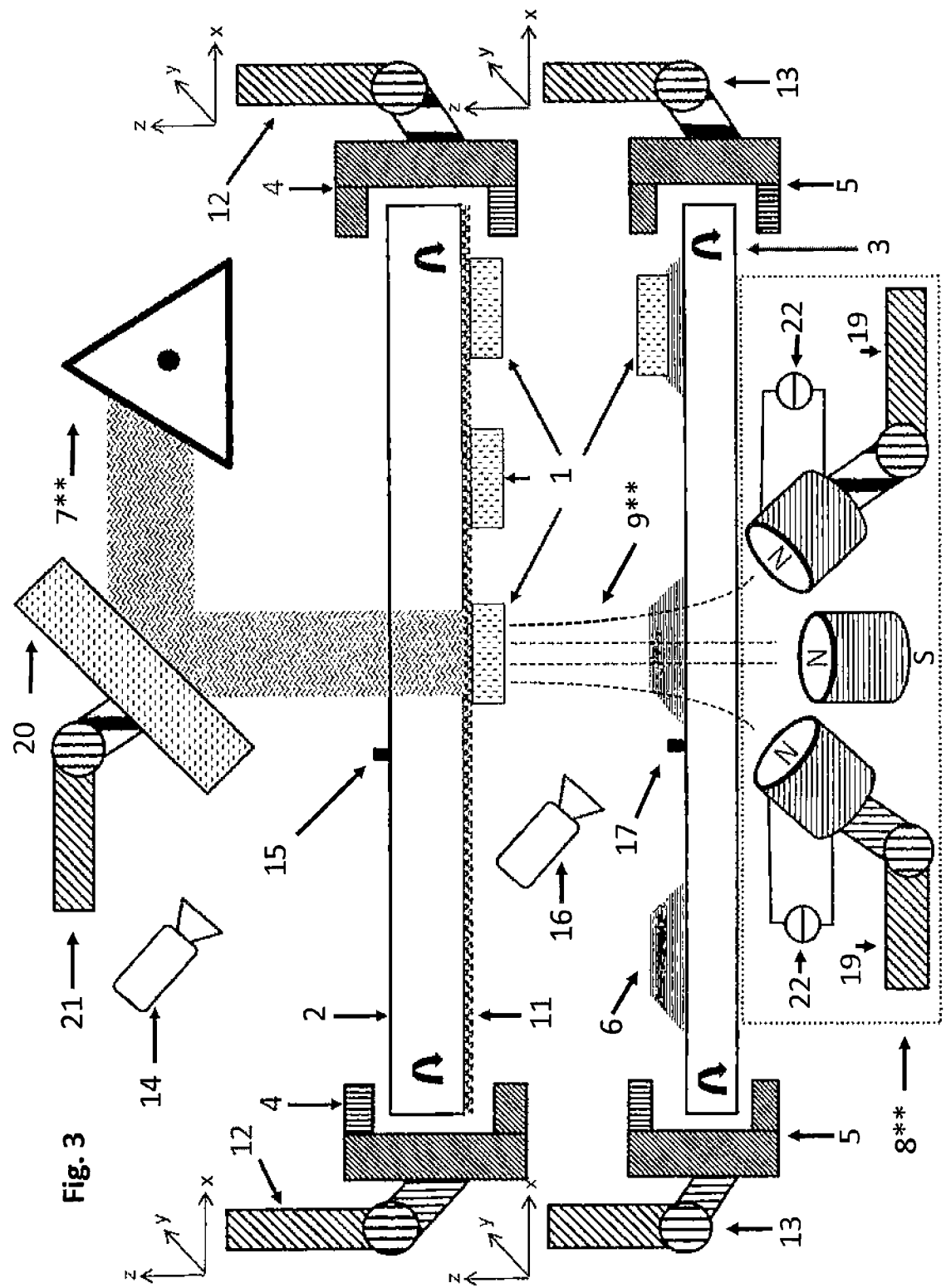
FIG. 3 is a schematic depiction of an exemplary embodiment of the device with a stationary laser, a positionable mirror and an arrangement of several partly positionable electromagnets, which are controlled by way of their power supply.

FIG. 3 shows an assemblage like FIG. 2 with two variants (modification A and modification B).

Modification A:

The laser 7 is a stationary laser in FIG. 3. The mirror 20 shown in FIG. 3 reflects the laser beam directed onto it onto a point determined by the ECU 18 on the rear side of the wafer foil 2. The mirror 20 is moved freely in space by a mirror positioning actuator 21, at least in one working area, wherein the mirror positioning actuator 21 here includes a three-dimensionally swivellable electric linear drive, which is controlled by the ECU 18. The mirror positioning actuator 21 further includes an electric motor likewise controlled by the ECU 18**, which motor facilitates a rotation of the mirror, at least up to a certain angle.

Modification B:

In FIG. 3 the magnetic arrangement **8\*\* replaces the magnetic arrangement 8\* from FIG. 2. The magnetic arrangement 8\*\* has all the features of the magnetic arrangement 8\*, but in addition parts of the magnetic arrangement in FIG. 3 can be positioned by the magnet adjustment or positioning devices 19**.

Two magnets of the magnetic arrangement **8\*\* shown are each moved freely in space by a magnet positioning actuator 19, at least in one working area, wherein each magnet positioning actuator 19 here includes a three-dimensionally swivellable electric linear drive, which is controlled by the ECU 18. Furthermore, each magnet positioning actuator 19 includes an electric motor likewise controlled via the ECU 18**, which motor facilitates a rotation of the respective magnet, at least up to a certain angle.

Figure 4:
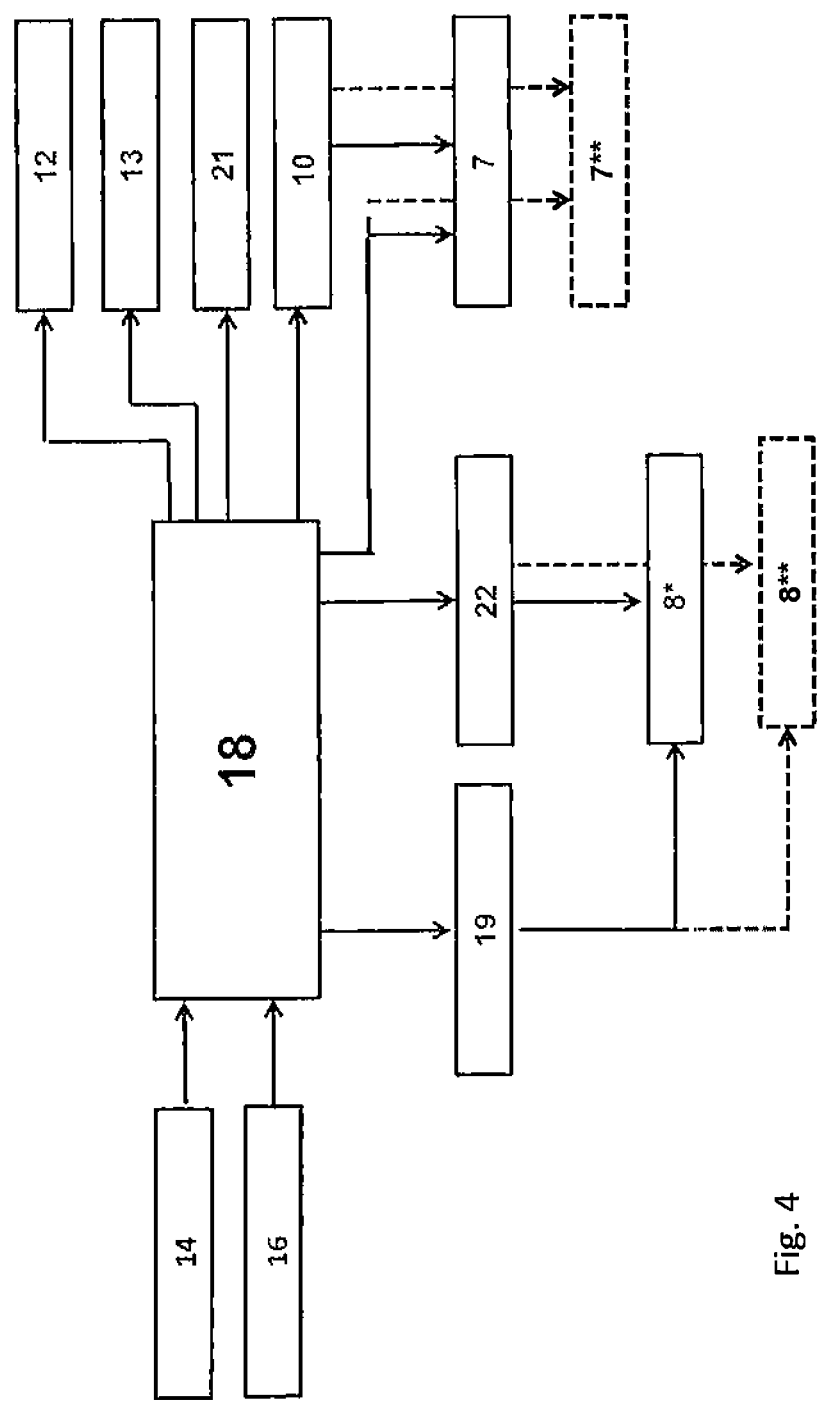
FIG. 4 is a schematic depiction of the control system as a block circuit diagram.

FIG. 4 shows a logic circuit diagram, which depicts schematically the information input and the control access of the ECU 18. All the reference signs refer to the preceding FIGS. 1 to 3 and their descriptions.

The variants of the device described here and their functional and operational aspects serve only for a better understanding of their structure, mode of operation and properties; they do not restrict the disclosure to the embodiments. The figures are partly schematic, wherein substantial properties and effects are depicted significantly enlarged in part, in order to clarify the functions, active principles, technical configurations and features. Each mode of operation, each principle, each technical configuration and each feature that is/are disclosed in the figures or in the text can be freely combined in any way with all claims, each feature in the text and in the other figures, other modes of operation, principles, technical configurations and features that are contained in this disclosure or result from it, so that all conceivable combinations are to be associated with the devices described. Combinations between all individual implementations in the text, meaning in each section of the description, in the claims and even combinations between different variants in the text, in the claims and in the figures are also comprised in this case and can be made the subject matter of other claims. Nor do the claims limit the disclosure and thus the combination possibilities of all features shown with one another. All disclosed features are explicitly disclosed here also individually and in combination with all other features.

The invention claimed is:

1. A device for transferring at least partly ferromagnetic electronic components from a dispensing carrier to a receiving substrate, wherein the device comprises:
   a first holding fixture for the dispensing carrier, which is configured and arranged to hold the at least partly ferromagnetic electronic components on a side of the carrier facing the substrate,
   a second holding fixture for the receiving substrate, which is configured and arranged to receive one of the components at a place predetermined for the one of the components on the substrate,
   a first actuator that is configured and arranged to move and/or to swivel the first holding fixture, and a second actuator that is configured to move and/or to swivel the second holding fixture,
   a detachment unit, which is configured and arranged at least to support a detachment of one of the components in each case from the carrier, in order to transfer it to the substrate,
   a magnetic arrangement, which is positioned relative to the second holding fixture for the substrate so that a magnetic field produced by it exerts a magnetic attraction force directed from the carrier towards the substrate on the one of the components, at least during the transfer of the component, wherein the attraction force at least supports a placement of the component onto the place predetermined for the one of the components on the substrate, characterized in that the detachment unit for detaching the components from the carrier is a laser that is controllable in its intensity,
   a mirror arrangement of one or more movable mirrors and at least one mirror positioning actuator, wherein the mirror positioning actuator is configured to move and/or to swivel at least a single mirror of the mirror arrangement to reflect an emitted laser beam of the detachment unit, and
   at least one programmable control unit with a memory function that is configured to control the first actuator and the second actuator, and/or to control each mirror positioning actuator of the mirror arrangement independently of one another in each case.

2. The device according to claim 1, wherein the magnetic arrangement comprises one or more permanent magnets and electromagnets, and at least one magnet adjustment or positioning device, which is configured and arranged to move and/or to swivel at least one magnet of the magnetic arrangement.

3. The device according to claim 1, wherein the second holding fixture for the substrate is configured and arranged to move the substrate successively or continuously relative to the first holding fixture for the dispensing carrier, wherein the substrate has a plurality of predetermined places for receiving components.

4. The device according to claim 1, wherein a side of the substrate facing away from the component is guided by the second holding fixture over a support.

5. The device according to claim 1, wherein the magnetic arrangement is positioned at least partly in a receiving device.

6. The device according to claim 1, further comprising a first imaging sensor, which is configured and arranged to determine a position of the component on the carrier directly and/or by detection of a reference marking, and a second imaging sensor, which is configured and arranged to determine a position of the component on the substrate directly and/or by detection of a reference marking.

7. The device according to claim 6, wherein the at least one programmable control unit is also configured to evaluate and/or store the information of the first sensor, and to evaluate and/or store the information of the second sensor.

8. The device according to claim 1, wherein the at least one programmable control unit is also configured to control the intensity of the laser.

9. The device according to claim 2, wherein the at least one programmable control unit is also configured to control each magnet adjustment or positioning device independently of one another in each case, and/or to control a power supply for each electromagnet independently of one another in each case.

10. A device for transferring at least partly ferromagnetic electronic components from a dispensing carrier to a receiving substrate, wherein the device comprises:

a first holding fixture for the dispensing carrier that is configured and arranged to hold the at least partly ferromagnetic electronic components on a side of the carrier facing the substrate, a second holding fixture for the receiving substrate that is configured and arranged to receive one of the components at a place predetermined for the one of the components on the substrate, a detachment unit that is configured and arranged at least to support a detachment of one of the components in each case from the carrier in order to transfer it to the substrate, a magnetic arrangement that is positioned relative to the second holding fixture for the substrate so that a magnetic field produced by it exerts a magnetic attraction force directed from the carrier towards the substrate on the one of the components, at least during the transfer of the component, wherein the attraction force at least supports a placement of the component onto the place predetermined for the one of the components on the substrate, characterized in that the detachment unit for detaching the components from the carrier is a laser that is controllable in its intensity, wherein the magnetic arrangement includes one or more permanent magnets and electromagnets and at least one magnet adjustment or positioning device that is configured and arranged to move and/or to swivel at least one magnet of the magnetic arrangement, a mirror arrangement of one or more movable mirrors and at least one mirror positioning actuator are provided, wherein the mirror positioning actuator is configured to move and/or to swivel at least a single mirror of the mirror arrangement to reflect an emitted laser beam of the detachment unit, and at least one programmable control unit with a memory function that is configured to control each magnet adjustment or positioning device independently of one another in each case, and/or to control a power supply for each electromagnet independently of one another in each case.

11. The device according to claim 10, wherein the second holding fixture for the substrate is configured and arranged to move the substrate successively or continuously relative to the first holding fixture for the dispensing carrier, wherein the substrate has a plurality of predetermined places for receiving components.

12. The device according to claim 10, wherein a side of the substrate facing away from the component is guided by the second holding fixture over a support.

13. The device according to claim 10, wherein the magnetic arrangement is positioned at least partly in a receiving device.

14. The device according to claim 10, further comprising a first imaging sensor that is configured and arranged to determine a position of the component on the carrier directly and/or by detection of a reference marking, and a second imaging sensor that is configured and arranged to determine a position of the component on the substrate directly and/or by detection of a reference marking.

15. The device according to claim 14, wherein the at least one programmable control unit is also configured to evaluate and/or store the information of the first sensor, and to evaluate and/or store the information of the second sensor.

16. The device according to claim 10 wherein the at least one programmable control unit is also configured to control the intensity of the laser.

\* \* \* \* \*